(12) United States Patent
Ohshima et al.

(10) Patent No.: US 7,339,167 B2
(45) Date of Patent: Mar. 4, 2008

(54) CHARGED PARTICLE BEAM APPARATUS

(75) Inventors: Takashi Ohshima, Higashimurayama (JP); Mitsugu Sato, Hitachinaka (JP); Soichi Katagiri, Kodaira (JP)

(73) Assignee: Hitachi High-Technologies Corporation, Tokyo (JP)

( * ) Notice: Subject to any disclaimer, the term of this patent is extended or adjusted under 35 U.S.C. 154(b) by 372 days.

(21) Appl. No.: 11/196,399

(22) Filed: Aug. 4, 2005

(65) Prior Publication Data

US 2006/0076489 A1 Apr. 13, 2006

(51) Int. Cl.
*H01J 37/256* (2006.01)
*H01J 37/28* (2006.01)
*H01J 49/24* (2006.01)

(52) U.S. Cl. .............. 250/310; 250/441.11; 250/289; 250/306; 250/307; 250/309

(58) Field of Classification Search .......... 250/441.11, 250/289, 301, 306, 307, 396 R
See application file for complete search history.

(56) References Cited

U.S. PATENT DOCUMENTS

| | | | |
|---|---|---|---|
| 5,644,132 A | 7/1997 | Litman et al. | |
| 6,218,664 B1* | 4/2001 | Krans et al. | 250/310 |
| 6,407,387 B1* | 6/2002 | Frosien et al. | 250/310 |
| 6,498,345 B1* | 12/2002 | Weimer et al. | 250/310 |
| 6,646,261 B2* | 11/2003 | Krans | 250/310 |
| 6,667,478 B2* | 12/2003 | Frosien et al. | 250/310 |
| 6,720,557 B2* | 4/2004 | Frosien | 250/307 |
| 6,730,907 B1* | 5/2004 | Feuerbaum et al. | 250/310 |
| 6,809,322 B2* | 10/2004 | Danilatos | 250/441.11 |
| 7,141,791 B2* | 11/2006 | Masnaghetti et al. | 250/311 |
| 7,223,974 B2* | 5/2007 | Petrov et al. | 250/310 |
| 2001/0048075 A1* | 12/2001 | Frosien | 250/307 |
| 2003/0062478 A1* | 4/2003 | Frosien et al. | 250/310 |
| 2003/0168595 A1* | 9/2003 | Danilatos | 250/310 |

FOREIGN PATENT DOCUMENTS

| | | |
|---|---|---|
| JP | 7-1681 | 1/1995 |
| JP | 2001-141015 | 5/2002 |
| WO | WO 01/57910 A1 | 8/2001 |

\* cited by examiner

*Primary Examiner*—Robert Kim
*Assistant Examiner*—Johnnie L Smith, II
(74) *Attorney, Agent, or Firm*—Antonelli, Terry, Stout & Kraus, LLP.

(57) ABSTRACT

A charged particle beam apparatus in which an electrostatic lens is used as a main focusing element to obtain a subminiature high-sensitivity high-resolution SEM, a drift tube for an electron beam is located inside a column between an electron source and a sample, and a detector for secondary electrons is located inside the drift tube. This solves the problem associated with the provision of a secondary electron detector, which heretofore has been a bottleneck in making a subminiature high-resolution SEM column.

20 Claims, 16 Drawing Sheets

CHARGED PARTICLE BEAM APPARATUS

CLAIM OF PRIORITY

The present application claims priority from Japanese application JP 2004-297117, filed on Oct. 12, 2004, the content of which is hereby incorporated by reference into this application.

FIELD OF THE INVENTION

The present invention relates in general to a scanning electron microscope (SEM) of the type which is used to observe microstructures typically using an electron beam; and, more particularly, the invention relates to a compact high-sensitivity high-resolution SEM and an electron beam applied apparatus, which are capable of implementing various sample observation functions.

BACKGROUND OF THE INVENTION

As an example of a compact high-resolution SEM, reference is made to FIG. 1 in JP-B No. 1681/1995. This compact high-resolution SEM is characterized by the fact that an electrostatic lens is provided for focusing electrons into an electron beam, where an electrode outside an objective lens is 0 V and a positive high voltage is applied inside the objective lens to accelerate electrons. However, this method has a problem in that, since the column has no vacuum pump and a secondary electron detector is located in a place different from the column, the apparatus size must be relatively large. Besides, this configuration makes it difficult to provide a number of columns and to move a column for purposes of extending the working distance of the measurement.

On the other hand, in an optical column of a charged particle beam apparatus as disclosed in JP-T No.522381/2003, the portion from an electron source to an objective lens inside the column is housed in a beam booster to create a high acceleration condition inside the column, in which detection is carried out using a collector containing fluorescent material for secondary electrons from a sample and a light guide to the outside. However, in accordance with this method, since the electron source is housed in the booster, a phase difference occurs between the beam booster and accelerator, and electrons emitted from the electron source are immediately accelerated by the beam booster electric potential. Consequently a strong electron lens effect is produced in the vicinity of the electron source. This results in a significant aberration which makes it difficult to achieve high resolution. For a compact apparatus, the beam booster must be small, and, thus, the beam booster's withstand voltage cannot be high. Therefore, a high voltage cannot be applied to the beam booster, and an electron beam emitted from the electron source cannot be accelerated sufficiently, so that it is impossible to achieve high resolution. Also, since the electron source is covered, it is difficult to create an ultra-high vacuum atmosphere necessary for operation of a high performance electron source.

A widely known approach to measuring the 3D structure of a sample through use of a SEM is that a cosine distribution, in which an emission angle distribution of secondary electrons is almost proportional to Cos θ with respect to the sample surface normal line, is utilized to measure a deviation in secondary electron emission distribution and to calculate a sample surface inclination to estimate a 3D structure. Usually, the overall size of this type of apparatus is large, because more than one secondary electron detector is provided. SEM systems which perform this measurement through a compact column incorporating detectors are shown in U.S. Pat. No. 5,644,132 and JP-A No.141015/2002. In these systems, a magnetic objective lens is used as a main focusing means for an electron beam, and secondary electrons from the surface of a sample irradiated with this beam are accelerated by an electric field generated at the bottom of the objective lens. The secondary electrons are passed through the objective lens, and the intensity distribution in each of the four directions is measured by a quadrant detector located above the lens to calculate secondary electron emission angle deviations. However, the magnetic lens is used mainly for focusing electrons into an electron beam, and the coil and magnetic circuit cannot be small in size. This makes it difficult to make the apparatus more compact. In addition, this method has a problem in that, while secondary electrons are passing through the magnetic field of the objective lens, their orbit rotates, so that this rotation angle must be taken into consideration in the calculation of a 3D structure. Therefore, there is a secondary electron energy distribution caused by each change in lens intensity, and the rotation angle varies with energy, resulting in a deterioration in measurement accuracy. Besides, since there is no electrode for controlling the charge caused by an electron beam, it is difficult to measure a semiconductor sample containing an insulating material.

SUMMARY OF THE INVENTION

The known technology has a problem in that it is difficult to obtain a high-resolution high-sensitivity image for observation with an SEM apparatus having a secondary electron detector and an electron source housed in a small housing. Also, there is difficulty in providing a compact SEM apparatus that is designed for stereoscopic observation.

An object of the present invention is to provide a high-sensitivity, high-resolution apparatus which enables microscopic observation or 3D observation of samples containing an insulating material, where a housing houses, or is equipped with, an ultra-high vacuum atmosphere maintaining mechanism for an electron source and a secondary electron detection system, which have heretofore been bottlenecks in the development of a subminiature, high-sensitivity, high-resolution SEM for practical use.

In order to solve the above-stated problem, an electrostatic lens is used as a main means for focusing electrons into an electron beam, a drift tube constituting a drift zone is provided between an electron source and a sample, and a detector of electrons generated from the sample is located inside the drift tube. The electron detector is divided into four or more areas. The drift tube is intended to make the acceleration of electrons higher than that of electrons impinging on the sample by application of a positive voltage. As a consequence, the acceleration of an electron beam is high in the zone from the electron source to just before the objective lens, and then the electron beam is decelerated by an electric field in the objective lens. A control electrode and a non-evaporative getter, which functions as a small internal pump, are located between the electron source and the drift tube, and the above-mentioned components are all covered by a housing. A heater for activating the non-evaporative getter is provided inside or outside the housing. The electron source has an ultra-high vacuum atmosphere, and one or two diaphragms are provided so that the outside of the housing has a low or middle degree of vacuum, and each diaphragm has an aperture through which an electron beam passes. This aperture produces a differential pumping condition between the electron source and the outside of the housing. Each diaphragm has a rough pumping valve for evacuating air from the electron source to the outside of the housing in the process of creating a vacuum atmosphere, and this valve is activated by bimetal in a temperature-dependent manner.

The present invention realizes a subminiature, high-sensitivity, high-resolution SEM incorporating a pump and a secondary electron detector. Furthermore, the invention makes it possible to provide highly functional SEM apparatuses based on electron beams, such as a subminiature SEM apparatus for 3D observation and a movable-column type or multicolumn type SEM apparatus.

BRIEF DESCRIPTION OF THE DRAWINGS

The invention will be more particularly described with reference to the accompanying drawings, in which:

FIG. 2A illustrates a valve condition at room temperature, and FIG. 2B illustrates a valve condition at 100° C. or more;

FIG. 3A illustrates an electronic optical system and FIG. 3B illustrates an electron detector inside a drift tube;

FIG. 5A shows a current sensor circuit, FIG. 5B shows a simple sensor circuit, and FIG. 5C shows a simple sensor circuit with an operational amplifier;

FIG. 7A shows the relation among maximum electron emission angle, secondary electron energy and sample voltage Vs, FIG. 7B shows the relation among minimum electron emission angle, secondary electron energy, and Vs, FIG. 7C concerns secondary electron capture yields, and FIG. 7D shows Vs dependency;

FIG. 11A is a diagram which illustrates the relation between a sample surface and the emission angle of electrons, FIG. 11B is a graph which shows the relation between secondary electron intensity and electron emission angle, and FIG. 11C is a diagram which illustrates imaging on sensor surfaces;

FIG. 12A illustrates an inspection device and FIG. 12B illustrates detection with an electron beam probe from a SEM column;

DETAILED DESCRIPTION OF THE PREFERRED EMBODIMENTS

First Embodiment

Figure 1:
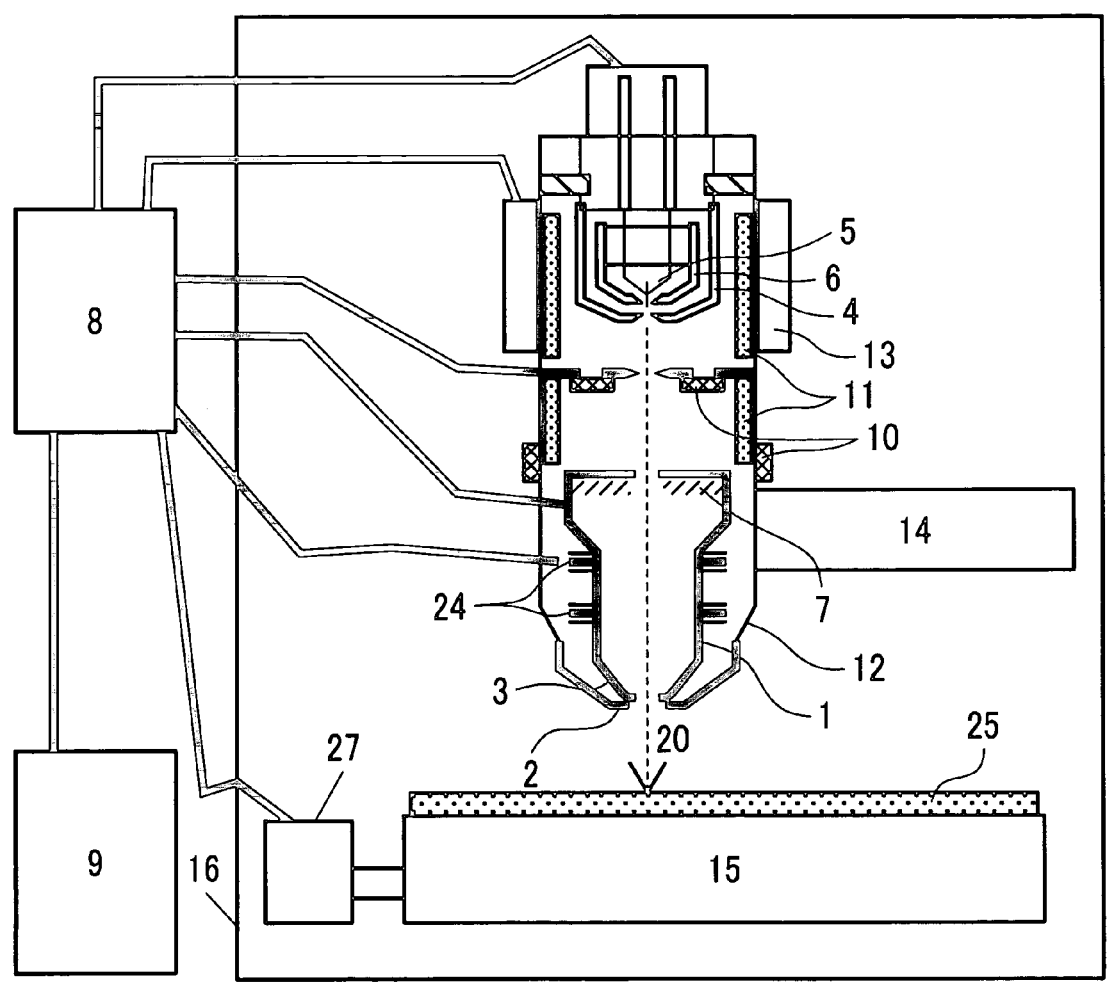
FIG. 1 is a diagram which shows a first embodiment of the present invention.

FIG. 1 schematically shows an embodiment of the present invention.

An electron source 5, such as a Schottky electron source, which is made of Zr/O/W, heated to 1600-1800 K, a suppressor electrode 6 and an extraction electrode 4 constitute an electron gun, which produces an electron beam probe 20 in the form of an electron beam. When the electron beam probe 20 impinges on a sample substrate 25, it is focused by an electrostatic objective lens, consisting of an objective lens inner electrode 3 located on the electron source side, and an objective lens sample side electrode 2 located on the sample side, so that it becomes a minute electron beam probe with a diameter of 30 nm to 2 nm. This beam is scanned in the x and y directions by a deflector 24, and released secondary electrons or backscattered electrons are detected by an electron detector 7 and converted into electrical signals, which signals are then processed by a controller 8, so that an SEM image appears on a display 9.

Figure 2A:
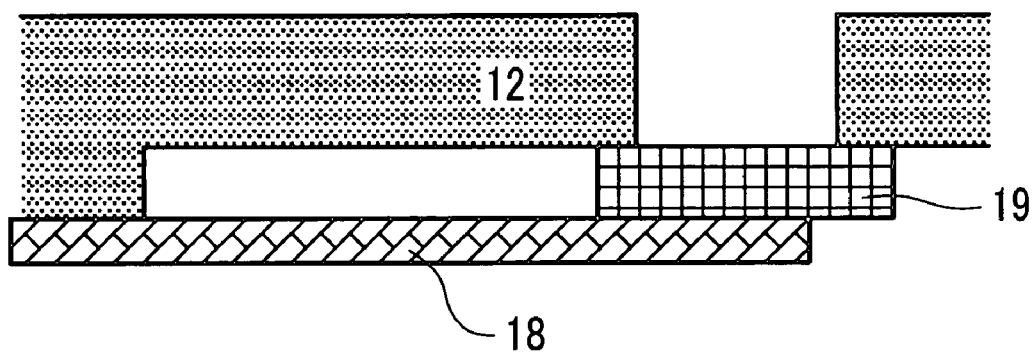
FIGS. 2A and 2B are diagrams which show how a valve works, where
Figure 2B:
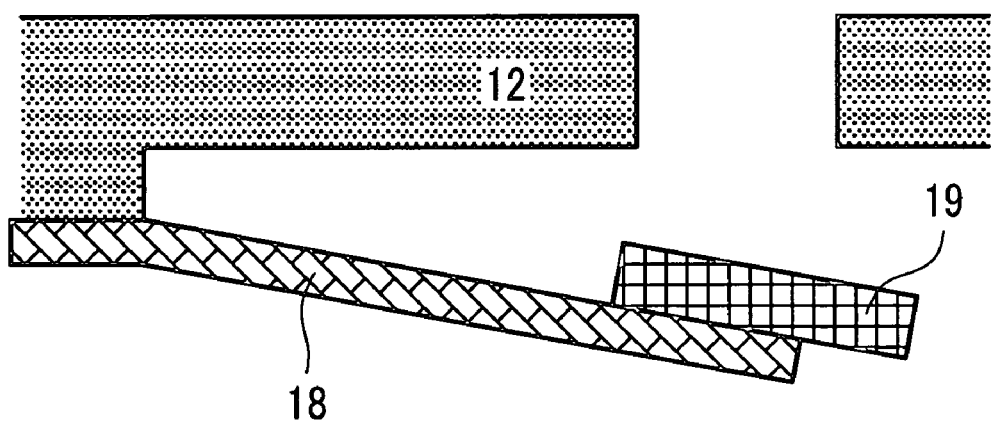

The SEM column is housed in a compact housing 12 (approximately 20 cm in length and 7 cm in diameter), and it is moved above a sample surface by transport means 14 so as to change the spot of observation. In this case, a sample stage 15 is mainly intended to hold a sample substrate 25 and to apply a sample bias voltage Vs, and it may be equipped with a sample moving mechanism 27 for changing the height, angle, and position thereof. The whole assembly is housed in a vacuum container 16 and is vacuumized. To vacuumize the apparatus after its assembly or maintenance, the air around the electron source 5 must be an ultra-high vacuum atmosphere of $10^{-7}$ Pa or so. Therefore, the following procedure should be taken. After air evacuation of the vacuum container 16 is started, a heater 13 is turned on and heated to about 100° C. This automatically opens valves 10 and promotes gas evacuation from the column. How the valves 10 work is shown in FIGS. 2A and 2B. At room temperature, as shown in FIG. 2A, a vent in a diaphragm 12 is covered by a valve 19, which is pressed by the spring force of a bimetal member 18, so that gas does not flow in or out. At 100° C. or more, as shown in FIG. 2B, the bimetal member 18 warps and the valve 19 is displaced from the diaphragm 12, so that gas flows from the high pressure side to the low pressure side through the vent with a high conductance. With the valves 10 open, the whole vacuum container is vacuumized to $10^{-4}$ to $10^{-5}$ Pa or so; and, one or two hours later, the power to the heater 13 is increased so that the lower part of the column is heated at 200° C. and the area around the electron source is heated to 400° C. for one hour or more. As a result of this heating, the adsorption gas inside the column is reduced, and a non-evaporative getter pump 11 is activated as an internal pump.

After that, cooling down to room temperature occurs and the valves 10 close. Consequently, a double differential pumping condition is produced between the area around the electron source and the outside of the housing 12 through an aperture through which an electron beam passes, so that the electron source is mentioned in an ultra-high vacuum atmosphere condition. When the non-evaporative getter pump adsorbs a given amount of gas, its performance deteriorates;

therefore, it is reheated as necessary so that it can be activated as a pump again. When the diameter of the aperture through which gas flows in and the getter pump displacement are adjusted to allow the pump to function effectively as a pump for half a year to one year, the number of man hours for maintenance can be decreased and the apparatus operating hours can be lengthened by reactivating the non-evaporative getter pump at the same time that the electron source 5 is replaced. The non-evaporative getter pump 11 may be replaced during maintenance.

This constitution offers an advantage in that, even if the sample is large, for example, a Si substrate with a diameter of 300 mm or more, or a substrate for a flat-panel display with 1 m or more on a side, the required size of the vacuum container 16 may be just the size of the sample stage 15 plus the surrounding space plus the vacuum container thickness. For observation of the whole area of the sample, a conventional SEM for semiconductors requires the sample stage to move by a distance twice as much as the width of the sample, both longitudinally and transversely. In the accordance with present invention, in an apparatus in which the column travels, the apparatus size can be about a quarter of the conventional apparatus size. When a preparatory chamber is provided to move the sample from the atmospheric air into the vacuum, the apparatus size is one half or less.

Figure 3A:
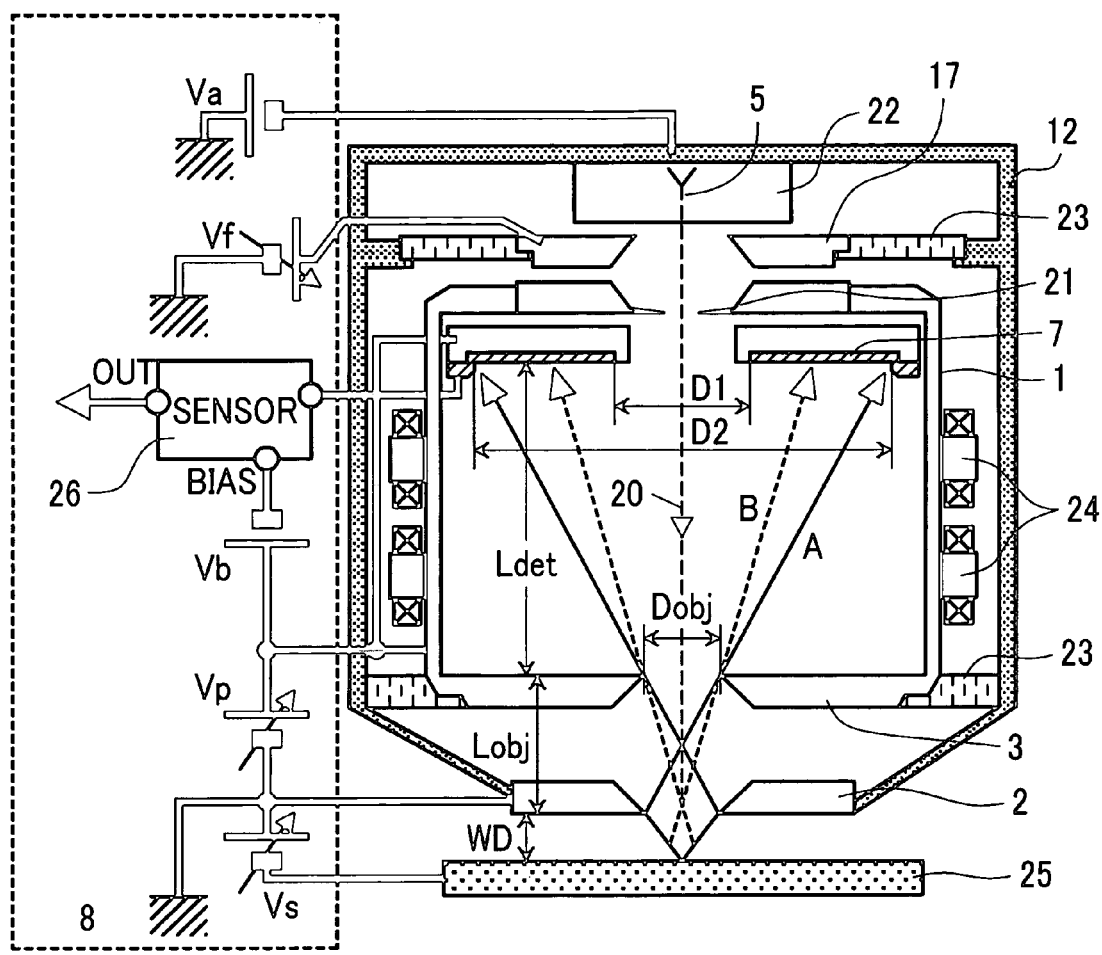
FIGS. 3A and 3B are diagrams which show details of an electron beam applied apparatus according to the invention, where

FIG. 3A provides a detailed explanatory view of the electronic optical system.

The voltage Vp that is applied to a drift tube 1 is between 4 kV and 20 kV depending on the working distance WD. When WD=5 mm, the voltage is approx. 5 kV; when WD=2 mm, the voltage is approx. 10 kV; and when WD<2 mm, it is between 10 kV and 20 kV. An accelerating voltage Va for electron beam acceleration is applied to the electron source 5; and, in this embodiment, Va is −1 kV or so. Preferably Va should be between −500 V and −3 kV or so. A drift zone where incoming electrons move at a constant speed is formed inside the drift tube 1, and, in the drift zone, electrons are kept at an energy level which is equivalent to the sum of the absolute values of the voltage Vp applied to the drift tube and the accelerating voltage Va applied to the electron source 1. A sample bias Vs is applied to the sample. The sensitivity for detection of secondary electrons can be controlled by adjusting Vs; and, in this embodiment, Vs is between 0 and −2 kV or so. An objective lens inner electrode 3 is located on the lower face of the drift tube. The objective lens inner electrode 3 may be integral with the lower face of the drift tube. The same level of voltage as the voltage Vp applied to the drift tube is applied to the objective lens inner electrode 3. By adjusting the electric field between the objective lens inner electrode 3 and the objective lens sample side electrode 2, the sample side principal plane of the objective lens is positioned between the objective lens sample side electrode 2 and the sample. When the sample side principal plane of the lens is nearer to the sample than to the objective lens, the lens aberration is reduced when WD is small.

Figure 4:
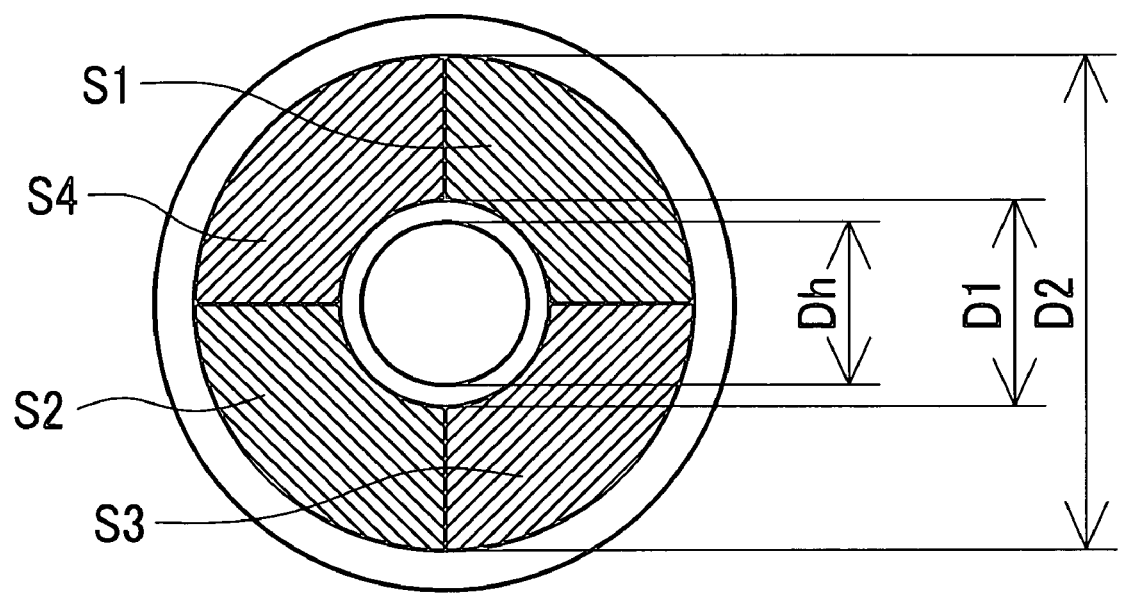
FIG. 4 is a diagram which illustrates a semiconductor detector.

For a sample containing an insulating material, in order to prevent the potential of the sample that is being irradiated with an electron beam and is being charged up from becoming high and interfering with the measurement, it is desirable that the electric field between the objective lens sample side electrode 2 and the sample substrate 25 does not exceed 250 V/mm. Secondary electrons generated on the sample substrate 25 move toward the objective lens, and some of them go through a hole into the drift tube 1. In this process, a lens effect due to acceleration is produced, so that secondary electrons impinge on the electron detector 7 along the orbits indicated by solid line A or broken line B in FIG. 3A. The orbit of secondary electrons depends on the working distance WD, the objective lens length Lobj and the applied voltages Vs, Vp. Here, the electron detector 7 is a semiconductor detector, as shown in FIG. 4. The electron detector is of the quadrant type, and its hole diameter, the inside diameter and outside diameter of its detection area, are represented by Dh, D1, and D2, respectively. The hole diameter Dh should be such that it does not interfere with the electron beam probe 20 and is desirably 0.1 mm or more, and, taking alignment into consideration for the sake of practical utility, it is more desirably 0.7 mm or more. The detection area inside diameter D1 should be as small as possible, because if it is too large, the secondary electron capture yield would deteriorate. To balance with the hole diameter Dh, the diameter D1 is desirably about 1.2 mm. For practical use, it should be between 1 mm and 6 mm. If that is the case, the distance Ldet from the upper face of the objective lens inner electrode 3 to the detector 7 should be large enough with respect to the inside diameter D1, and preferably, it is 10 to 60 times as large as D.

The larger the outside diameter D2 is, the wider the secondary electron capture area is. However, it should be optimized considering the fact that the column size is small. When orbit A of FIG. 3 is used, the following relation (Equation 1) should exist in connection with the distance Ldet from the upper face of the objective lens inner electrode 3 to the detector 7:

$$D2=(1+2\ Ldet/Lobj)Dobj \quad \text{(Equation 1)}$$

No electrons come beyond this.

When orbit B is used, the following relation (Equation 2) should exist:

$$D2=(1+Ldet/Lobj)Dobj \quad \text{(Equation 2)}$$

For practical use, D2 should be within the range of these values ±20%, taking Vs into account. If D2 is fixed, Ldet may be determined from the above equations 1 and 2 as follows:

$$0.5Lobj((D2/Dobj)-1) \leq Ldet \leq Lobj((D2/Dobj)-1) \quad \text{(Equation 3)}$$

Furthermore, various values should be determined so that the following equation is satisfied as the condition for the electron optical system:

$$0.01\ \text{mm} < Dobj < Lobj/2,\ 50 < |Va| < 2000,\ 4 \leq Vp/|Va| \leq 20 \quad \text{(Equation 4)}$$

When Vp/|Va| is less than 4, the electron beam diameter is in excess of 20-30 nm, and this can be achieved sufficiently with a conventional decelerating electrostatic lens.

The present invention uses an accelerating electrostatic lens, i.e. an electronic lens in which electrons are accelerated, to achieve high sensitivity and high resolution. For this purpose, it is desirable that Vp/|Va| is 4 or more. It is known that the larger Vp/|Va| is, the shorter focal distance the objective lens has and the smaller the electron optical system aberration is. As a result, a system with a small electron beam diameter, namely a high resolution system, will be obtained. The upper limit for Vp/|Va| depends on the withstand voltage between the objective lens sample side electrode 2 and the objective lens inner electrode 3. For example, when Lobj=5 mm, on the assumption of a material wall thickness of about 1.5 mm, the air gap will be 2 mm and the maximum voltage 20 kV, considering that up to a 10 kV/mm electric field may be used with no discharge. For this practical Va value, WD is approx. 1 mm at 1 kV and the aberration is 2-4 nm; as a consequence, the upper limit for Vp/|Va| is 20. If Lobj is increased, the withstand voltage increases, but a larger voltage must be applied in proportion thereto in order to maintain the electronic lens condition constant. For example, if Vp exceeds 20 kV, a larger feed-through insulator, which leads electricity from a power cable in the air into a vacuum chamber, must be large enough to prevent creeping discharge, and also gas sealing or resin sealing is needed to prevent corona discharge in the air. This is not desirable for this embodiment's purpose of realizing a compact SEM structure. Hence, 20 or so is desirable as the upper limit for Vp/|Val.

Figure 7A:
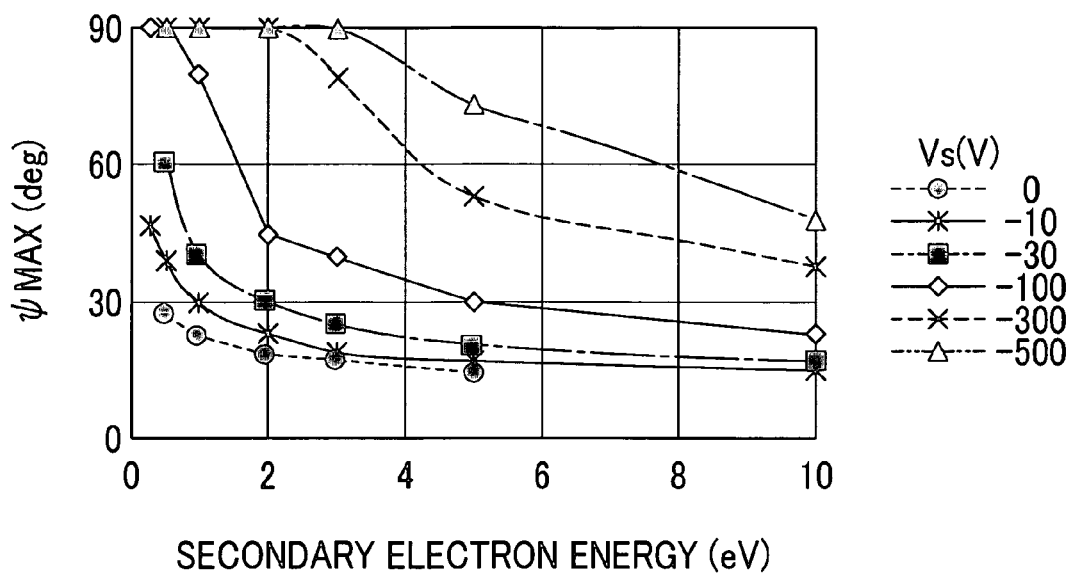
FIGS. 7A, 7B, 7C, and 7D are graphs concerning secondary electrons, where
Figure 7B:
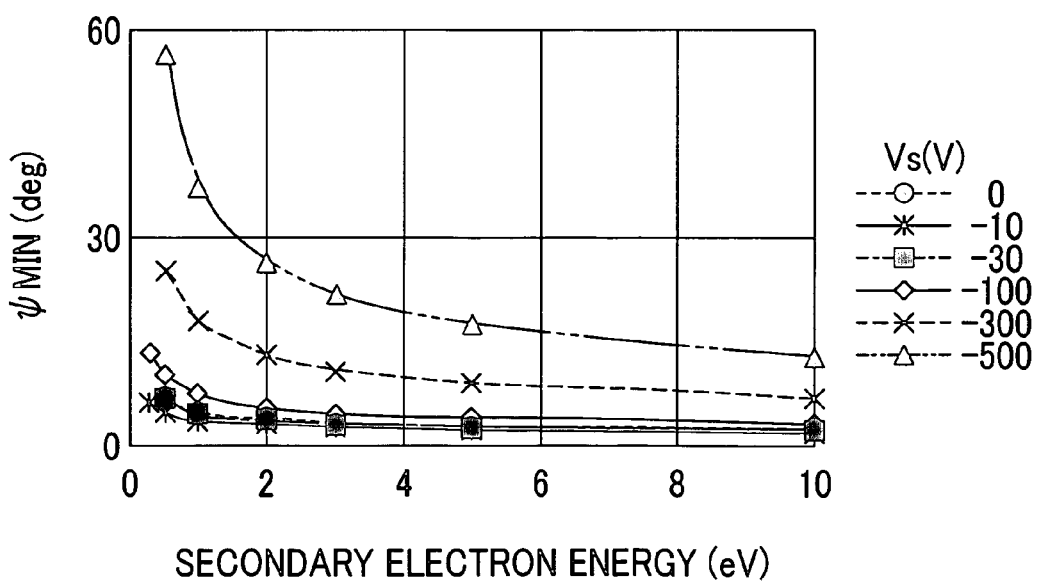
Figure 7C:
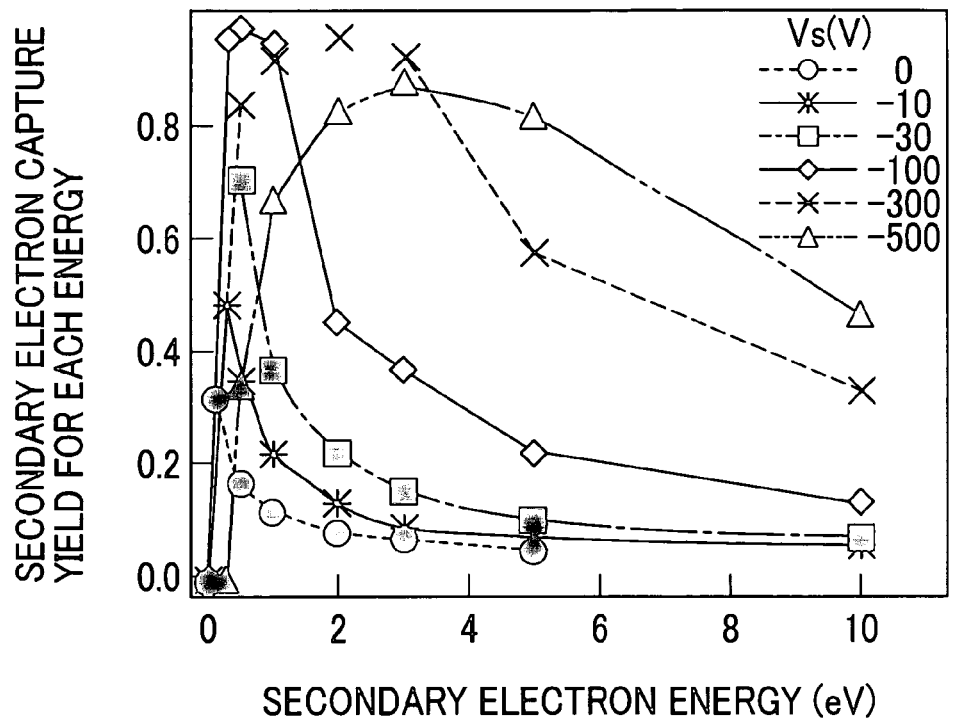
Figure 7D:
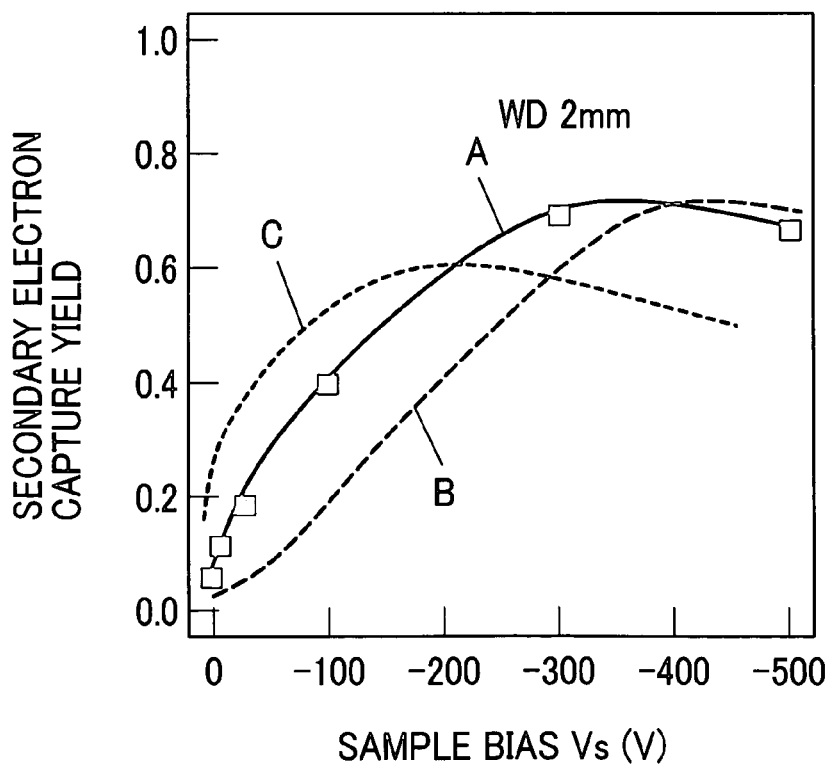
Figure 8:
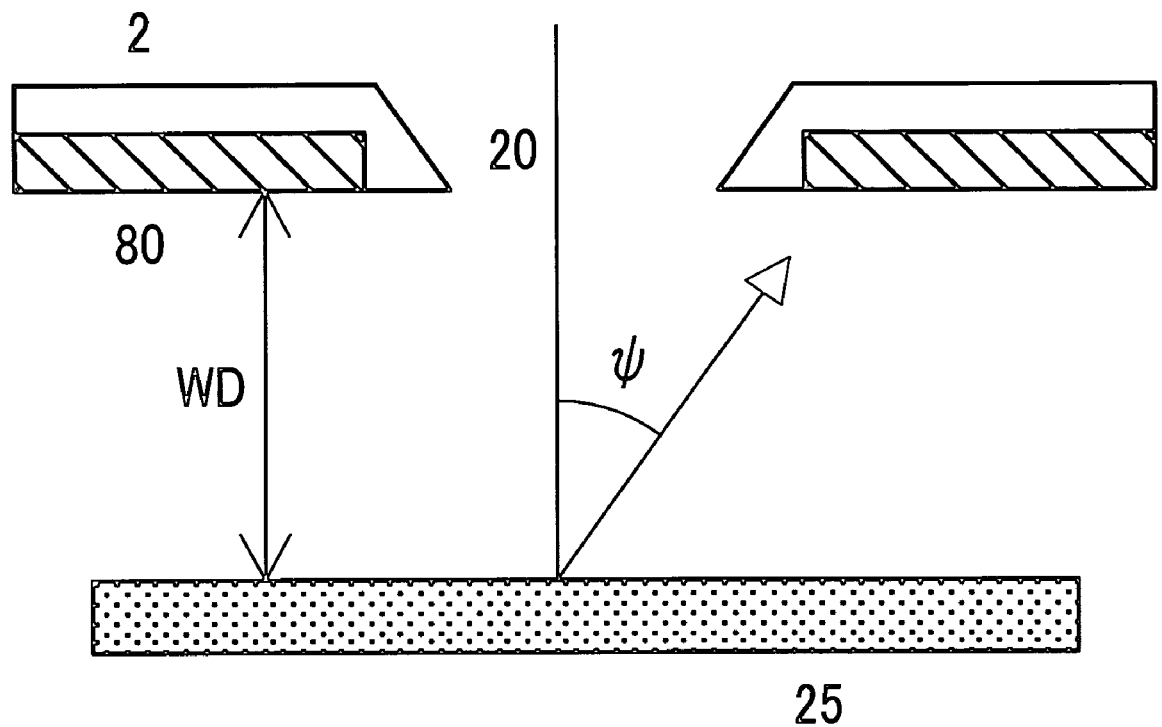
FIG. 8 is a diagram which shows an emission angle of an electron from a sample.

In this embodiment, when Lobj=5.5 mm, Dobj=0.8 mm, Ldet =60 mm, and WD=2 mm, it is desirable that Vp is 10 kV and Vf is between 1 kV and 3 kV. Data on secondary electrons in this case are shown in FIGS. 7A to 7D. Secondary electrons emitted from the sample substrate 25 have different energies and different emission angles ψ and then take different orbits; and, in order for them to reach the electron detector 7, they must pass through the aperture of the objective lens. If the emission angle is too large, they will be intercepted by the objective lens and cannot go upward. Here, the emission angle ψ refers to the angle formed between the normal line on the sample surface and the direction of electrons emitted from the sample, as shown in FIG. 8. The maximum emission angle ψmax which allows electrons to go above the objective lens varies according to the secondary electron energy and Vs, as shown in FIG. 7A. When D1=1.2 mm, electrons emitted at a smaller angle than the minimum emission angle ψmin will fall inside D1 and cannot be detected. The relation among ψmin, the secondary electron energy and Vs is shown in FIG. 7B. Since the secondary electron emission volume is proportional to Cos ψ summing up electrons in all directions in the range from ψmax to ψmin, the secondary electron capture yield for each energy is as shown in FIG. 7C. Curve A in FIG. 7D represents the Vs dependency where secondary electron capture yields are calculated, taking the factor of secondary electron energy distribution into account. This graph indicates that the optimum condition for secondary electron capture yields is around Vs=−300 V, and, when this condition is met, the highest sensitivity will be achieved.

From FIG. 7C, it can be seen that the capture yield of electrons reaching the detector peaks at a certain energy level which varies depending on Vs. As the value of −Vs is larger, the capture yield peaks at a higher energy level. This suggests that this secondary electron detection system functions as an energy filter. This effect can be utilized to make quantitative evaluations of surface charge potentials or discriminate materials according to secondary electron energy distributions. For instance, if part of the sample surface is charged negatively, the energy of emitted secondary electrons is higher by the amount equivalent to the charge, and, therefore, as −Vs is smaller, the signal amount decreases and vice versa, as indicated by broken line B in FIG. 7D. On the other hand, if the sample surface is positively charged, the energy distribution shifts toward the lower energy side and the signal amount peaks at a smaller value of −Vs, as indicated by dotted line C. Since the relation between the charge and the secondary electron signal amount vs. −Vs curve is inherent to each apparatus condition, quantitative evaluations of charge potentials can be made by calculating or actually measuring the above-stated relation for each measuring condition beforehand.

In this case, the maximum outside diameter for secondary electrons to reach the detector 7 depends on Vs, as shown in Table 1, which suggests that D2 should be 10 mm or so. This corresponds to orbit B in FIG. 3.

TABLE 1

| Vs(V) | Max. outside diameter for secondary electrons to reach the detector (mm) |
|---|---|
| 0 | 6.6 |
| −10 | 9.0 |
| −30 | 10.8 |
| −100 | 10.6 |
| −300 | 7.2 |
| −500 | 5.2 |

Figure 5A:
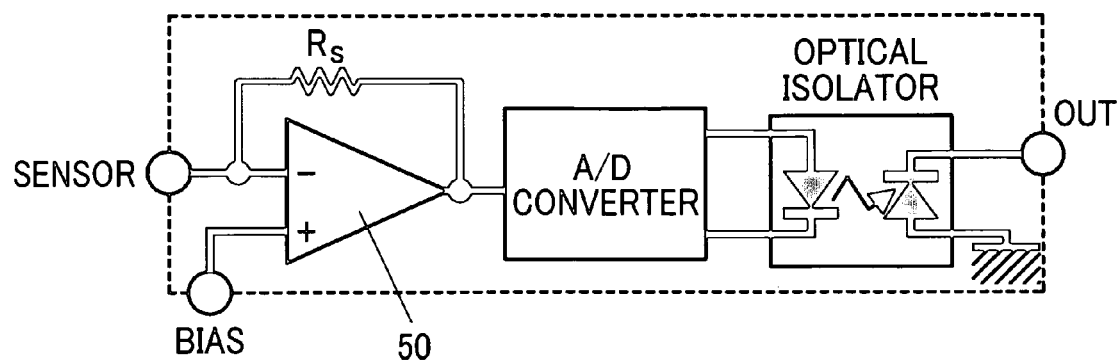
FIGS. 5A, 5B, and 5C are schematic circuit diagrams which concern a current sensor, where

In the semiconductor-based electron detector 7, as shown in FIG. 4, electron sensing surfaces S1, S2, S3, and S4 face the sample and function as independent diode type electron sensors. The electric potential of this detector 7 is kept at the same level as the potential Vp of the drift tube 1. Here the "same level" implies a tolerance of ±10 V. Bias voltage Vb is superimposed on the sensing surfaces S1, S2, S3, and S4. Vb is selected in the range of 0 to −100 V. A current sensor 26 is provided to measure the current which flows when Vb is applied to the sensing surfaces S1, S2, S3, and S4, and its output is transmitted from an Out terminal to the controller 8 as a secondary electron signal. The current sensor may have a structure as shown in FIG. 5A. The beam taken out from S1, S2, S3, and S4 of the electron detector 7 to the atmospheric air via a feed-through enters the sensor terminal while the voltage Vb superimposed on Vp is supplied to the Bias terminal.

A current-voltage conversion circuit, composed of an operational amplifier 50 and a sensor resistance Rs, outputs a voltage which results from multiplication of the current flowing while keeping the sensor terminal potential equivalent to the Bias terminal potential, by −Rs. This is converted into a digital signal by the AD converter. Since a high voltage Vp is superimposed so far, an optical isolator is provided in order to adjust the potential to the signal processing system of the controller 8. Here, the optimum value of Rs must be selected to suit the measuring signal intensity; and, if the condition may change, it is convenient to use Rs as a variable. In FIG. 5A, a photo-coupler is employed as the optical isolator, but an optical fiber may be used instead. Instead of optical means, a transformer may be used for isolation. If a high accuracy is not needed, optical means or a transformer serving as an isolator may be used for an analog signal as it is, or without converting it into a digital signal. In this case, the advantage is low cost. Another advantage of analog signals is that the accuracy is improved when signals are converted into high frequency ones by amplitude modulation or frequency modulation or the like.

Figure 5B:
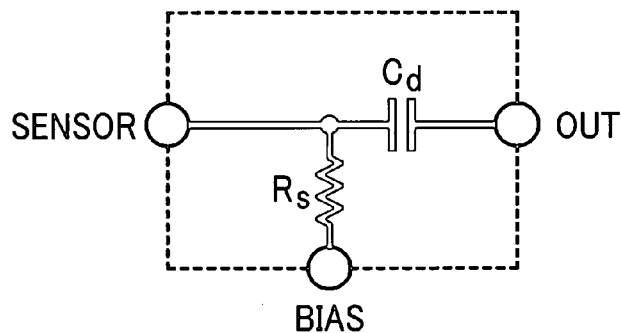
Figure 5C:
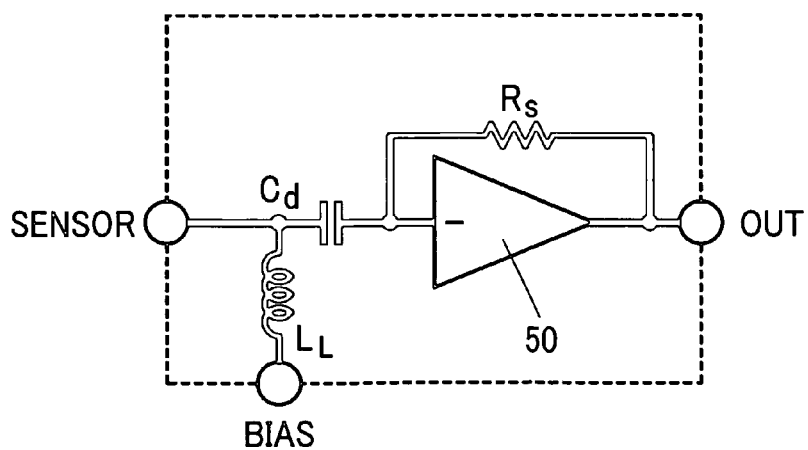

If the signal intensity is sufficiently high, a simple circuit which uses a sensor resistance Rs and a decoupling capacitor Cd, as shown in FIG. 5B, is acceptable. In this case, low cost and compactness can be assured. Another advantage is that, thanks to the structural simplicity, it may be located in a vacuum, device and the number of high voltage wires can be decreased. To cope with higher frequencies, an operational amplifier 50 may be added, as shown in FIG. 5C. In this case, an electric potential is supplied through coil $L_L$ so that high frequency component signals do not flow toward the Bias terminal side.

Regarding backscattered electrons from the sample substrate 25, about 90% of them strike the objective lens sample side electrode 2 when the working distance WD is 2 mm or more. Therefore, it is desirable to place a backscattered electron detector 80 on the lower face of the objective lens sample side electrode 2. In this case, preferably, the detector should provide a high sensitivity even at a low acceleration, such as 1 kV or so and have a thickness of 2 mm or less. It may be a semiconductor detector for low accelerations, a MCP (multi-channel plate), or the like. When the working distance WD is 2 mm or less, many backscattered electrons go through the aperture of the objective lens into the drift tube 1, which means that secondary electron information and backscattered electron information can be selectively acquired depending on the value of WD.

Figure 9:
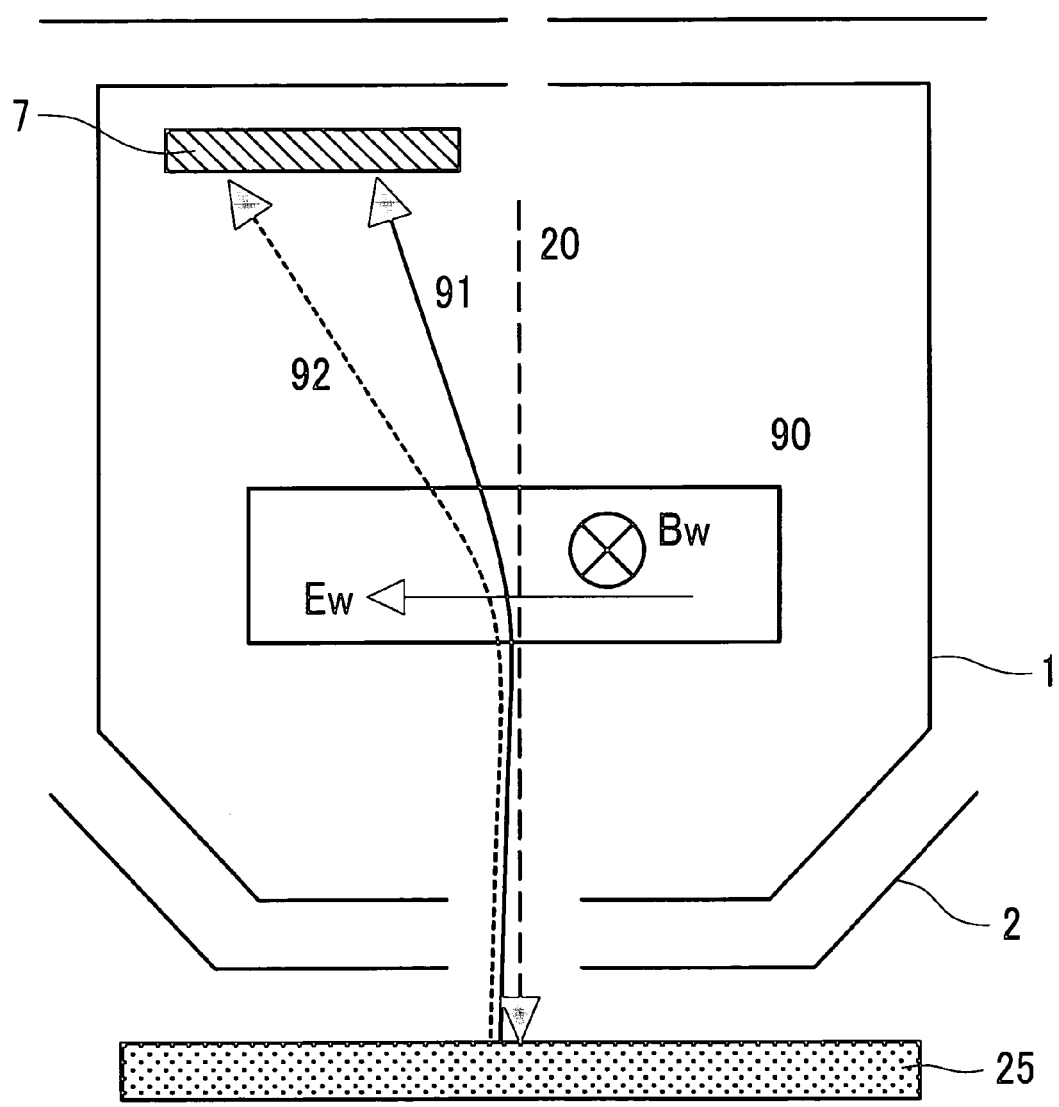
FIG. 9 is a diagram which shows the inside of a drift tube as an example.

In this embodiment, the electron detector 7 is a doughnut-shaped quadrant type of detector. However, the type of electron detector is not limited thereto; if it is segmented in its diameter direction, more detailed energy distributions can be determined. Alternatively, it may be divided into two parts or not divided at all. Furthermore, for high speed operation, an electron detector which has no hole or is not divided may be located off the axis through which the electron beam probe 20 passes. In this case, since the capacitance of the detector can be decreased, high speed image acquisition is possible. For example, as shown in FIG. 9, when a Wien filter 90 is placed in the drift tube 1 and the central orbit 92 of secondary electrons or the central orbit 91 of backscattered electrons, which come from the sample substrate 25, is bent before reaching the electron detector, on the condition that the electron beam probe 20 goes straight through a magnetic field Bw and an electric field Ew, measurement can be with high sensitivity. Here, the relation of v×Bw=Ew exists, where v represents the electron beam probe velocity. If the intensity of Bw or Ew is regulated, secondary electrons and backscattered electrons can be selectively observed, because they are different in kinetic energy. Such an advantageous effect also can be produced, without a Wien filter, by installing a field control electrode, like an axisymmetrical decelerating electrode, inside the drift tube. In this case, an electric field whose intensity does not seriously affect the orbit of the electron beam probe 20 is generated, thereby controlling the spread of the orbits of secondary electrons and backscattered electrons to obtain the optimum condition for the detector 7. Since it is sufficient to add a single electrode in this case, the structure is simplified. Since electrons to be detected here spread on the same axis, it is desirable that the detector 7 is doughnut-shaped, as shown in FIG. 4.

Figure 3B:
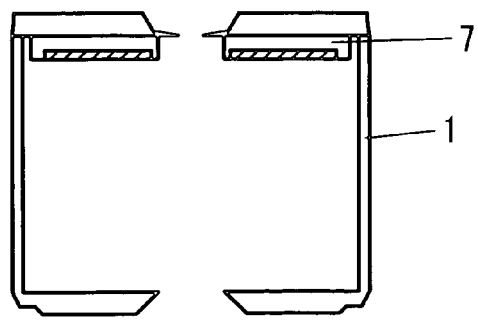

In this embodiment, the electron detector is located inside the drift tube; however, the inner upper wall of the drift tube may be integral with the electron detector, as shown in FIG. 3B. Integration of the drift tube and electron detector helps shorten the manufacturing process.

In this embodiment, electron beam scanning, axis alignment and stigma adjustment are performed in a magnetic field from coils 24 placed around the drift tube 1. Hence, desirably, the material of the drift tube 1 should be nonmagnetic, and it is often made of Ti or a nonmagnetic stainless steel. Also, the same effect can be produced by the use of an insulator structure, which is mainly made of an insulating material, such as $SiO_2$ or $Al_2O_3$, and has a coaxial hole whose inner wall is conductively coated. For deflection, an electric field may be employed instead of a magnetic field; for example, an 8-pole electrostatic deflector may be installed in a double high acceleration zone to achieve a similar effect. This method is more suitable for high speed operation than the method based on use of a magnetic field.

Figure 6:
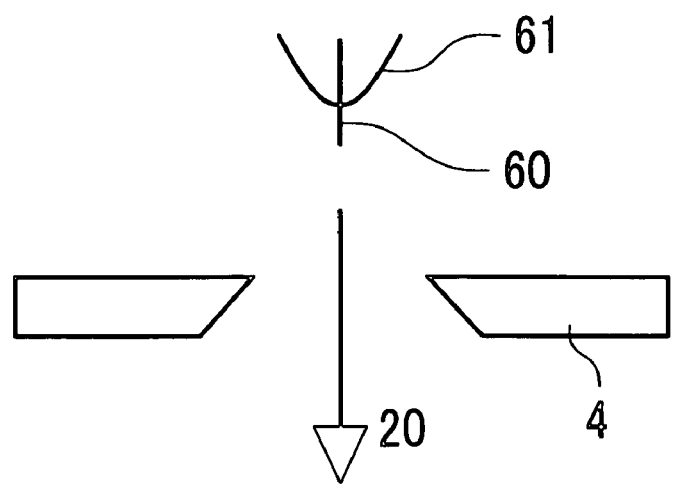
FIG. 6 is a diagram which shows an example of an electron beam.

Although this embodiment adopts a Schottky type electron source, another type of electron source may be used. It is also acceptable to mount a field emission electron source 60, such a as W310 or a carbon nanotube, on a filament 61 in such a way as to face the extraction electrode 4, as shown in FIG. 6. In this case, since the electron gun requires no suppressor electrode, a simpler structure is realized. Besides, since the electron source size is very small (10 nm to 3 nm) and the energy distribution is minimized (0.2 eV), this approach offers an advantage in that the chromatic aberration is small and a very high resolution is achieved.

In addition, although this embodiment adopts an electrostatic lens for focusing electrons into an electron beam probe, a magnetic field may be superimposed by a small coil or permanent magnet, so long as an electrostatic lens is used as the main focusing means. Some examples are as follows. If an axisymmetrical magnetic field is generated in the vicinity of the sample and the objective lens, secondary electrons come back into the column along the line of magnetic force, and the sensitivity to secondary electrons is high. If a coaxial magnetic field is superimposed in the vicinity of the electron source, a large probe current can be obtained. Also, the use of a field emission electron source whose size is small is advantageous in that magnetic superimposition reduces aberration and enhances the resolution.

Second Embodiment

Figure 10:
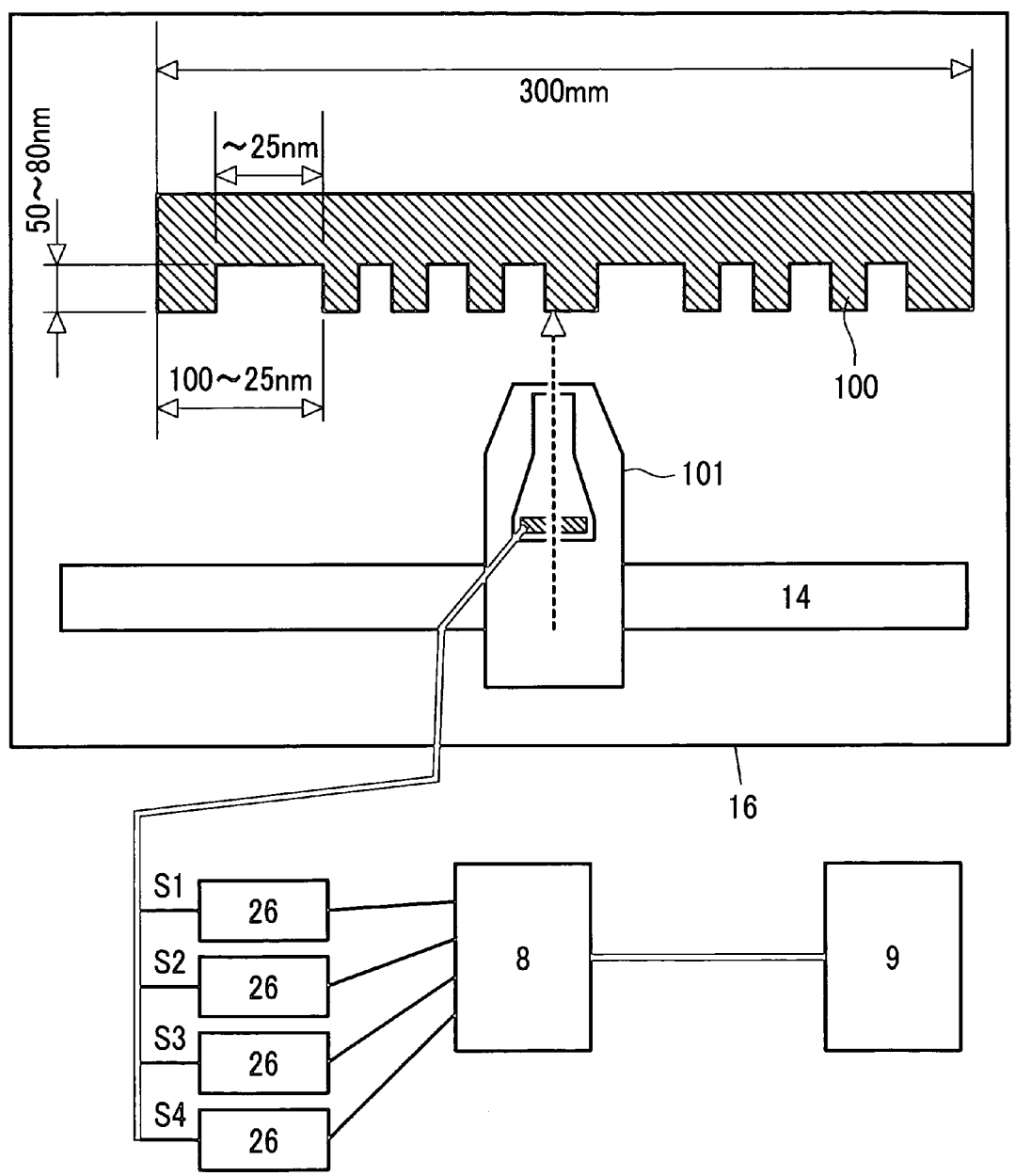
FIG. 10 is a diagram which schematically shows a second embodiment of the present invention.

FIG. 10 schematically shows a second embodiment of the present invention.

This embodiment concerns an inspection device for a mold 100 for use in the nano-in-print process as a means for formation of nanopatterns on substrates, to which the present invention is applied. The nano-in-print process is a process whereby nanopatterns are formed as follows: a thin coating of thermally or optically curable resin is formed on a Si, plastic or glass substrate; a mold is pressed against it to shape it; the resin is cured by heat or ultraviolet rays; then the mold is released. Because ultraviolet rays may be used and thermal expansion or plastic deformation is undesirable, the mold is made of glass or quartz. For this process, the 3D structure of the mold is important for the sake of mold releasability and pattern accuracy. The object size range for optical inspection, such as with a confocal microscope, is too small to measure this mold. On the other hand, the use of a conventional SEM in a 3D inspection device has the following problem: the accelerating voltage is high and charging up is unavoidable; and the sample chamber is large and the apparatus size is large, leading to high cost.

In the structure as shown in FIG. 10, the same SEM column 101 according to the present invention, as shown in FIG. 1, is mounted on the transport means 14, and the surface of the nano mold 100 is observed through the SEM from below. Observation through the SEM and column transportation can be performed simultaneously. Secondary electron signals are taken from the four sensors S1, S2, S3, and S4 of the quadrant electron detector 7 through four current sensors 26 individually. According to these signals, an image of the surface 3D structure is generated in the controller 8 and shown on the display 9. Next, how a 3D image is generated will be explained with reference to FIG. 11.

Figure 11A:
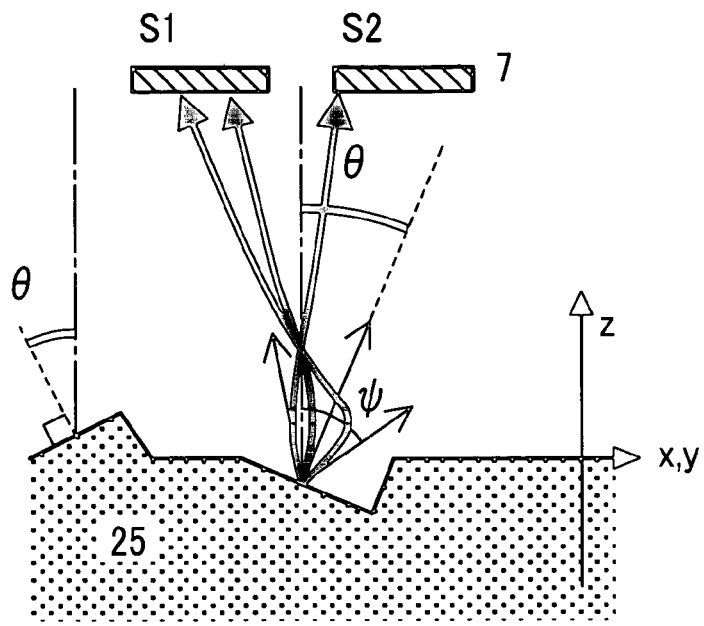
FIGS. 11A, 11B, and 11C show a 3D detection method, where
Figure 11B:
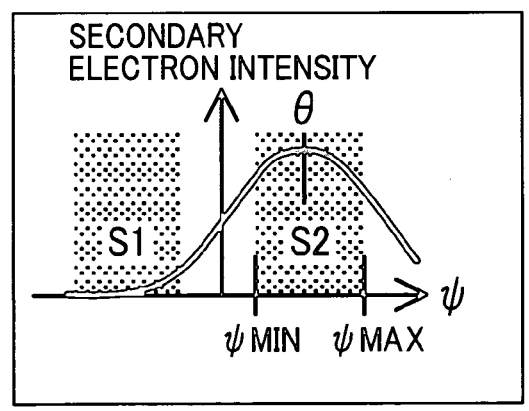

If the surface of the sample substrate 25 is uneven, as shown in FIG. 11A, and a sample surface on which the electron beam probe impinges is inclined by an angle θ with respect to the normal line of the sample substrate, the center of the distribution of secondary electrons emitted from the sample surface also will be inclined by θ. Since the SEM column according to the present invention uses an electrostatic lens, the secondary electron orbit does not rotate, and a deviation in the electron emission direction is directly reflected in the detector 7. Further, as shown in FIG. 11A, the electron emission angle ψ with respect to the sample substrate normal line corresponds to the point at which an electron impinges on the detector 7 (distance from the axis center, in this case) almost on a one-to-one basis. Hence, as the center of distribution of emitted electrons inclines, the detected intensity differs between the sensors S1 and S2 of the detector 7. This relation is shown in FIG. 11B, where electrons detected by the sensors S1 and S2 are in the emission angle range from ψmin to ψmax and there is a difference in intensity because of θ deviation of the center of the distribution. Since the secondary electron angle distribution is a cosine distribution on the emission surface, the curve in the graph is expressed by Equations 5, where detected electron intensities on S1 and S2 are represented by a(ψ) and b(ψ), respectively.

$$a_{(\psi)} = f_{(\psi)} g_{(\theta)} \cos(\theta - \psi)$$

$$b_{(\psi)} = f_{(\psi)} g_{(\theta)} \cos(\theta + \psi) \quad \text{Equations 5}$$

Figure 11C:
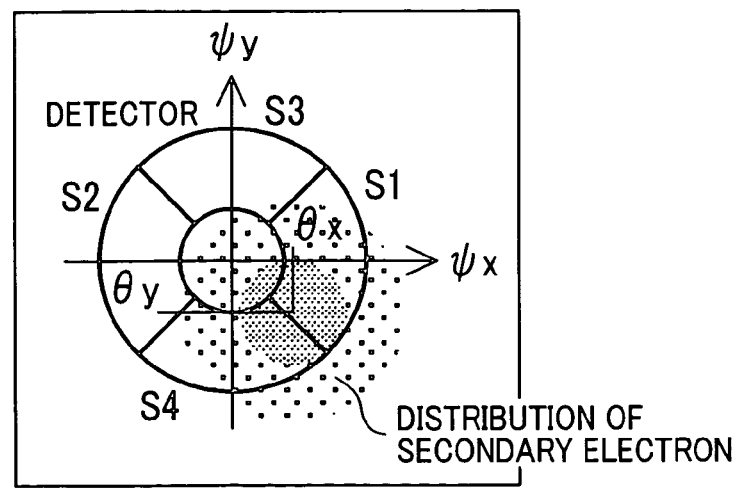

Here, f(ψ) denotes dependency of the column's detection efficiency on ψ, and g(θ) denotes secondary electron yield on the sample surface. f(ψ) can be treated as almost constant in the range from ψmin to ψmax. Also, at a low acceleration speed around 1 kV, since electrons are unlikely to get deep into the surface, g(θ) can be treated as almost a constant. Usually, the surface can be inclined (θ) in various directions (x and y). When the inclination is analyzed as θx, θy, mapping on the emission angle space (ψx, ψy) is made on the sensors S1, S2, S3 and S4, as shown in FIG. 11C. Here, the detected intensities on S1 and S2 are respectively expressed as follows:

$$a_{(\psi,\theta)} = f_{(\psi)} g_{(\theta)} \cos\theta (\cos\psi + \sin\psi \tan\theta_x)$$

$$b_{(\psi,\theta)} = f_{(\psi)} g_{(\theta)} \cos\theta (\cos\psi - \sin\psi \tan\theta_x) \quad \text{Equations 6}$$

For data from S3 and S4, x and y in Equation 6 should be exchanged. From Equations 6, θ and θx are easily calculated as follows:

$$\theta = \cos^{-1}\left(\frac{1}{g_{(\theta)}} \frac{a_{(\psi,\theta)} + b_{(\psi,\theta)}}{a_{(\psi,0)} + b_{(\psi,0)}}\right) \quad \text{Equation 7}$$

$$\theta_x = \tan^{-1}\left(4 a_{(\psi,0)} \sqrt{f_{(\psi)}^2 g_{(\theta)}^2 - a_{(\psi,0)}^2} \frac{a_{(\psi,\theta)} - b_{(\psi,\theta)}}{a_{(\psi,\theta)} + b_{(\psi,\theta)}}\right) \quad \text{Equation 8}$$

From Equations 7 and 8, surface inclinations can be quantified based on measured values. Here, a(ψ,0) and b(ψ,0) denote measured values at θ=0 (flat surface). From data from S3 and S4, θ and θy are calculated by exchanging x and y in the above equations.

For higher accuracy, it is advisable to calculate or measure the relation between electron volume and θ, as detected by sensors S1, S2, S3, and S4 in FIG. 11C, and to store it in a database beforehand, so that a comparison can be made later against the database.

With the above process, a 3D structure is according to θ, θx, and θy calculated from signals from the four sensors and distance data acquired by scanning with the electron beam probe.

In this embodiment, since the detector is divided into four parts (quadrant type), the acquired data may overlap; therefore, a 3D image with less noise and higher accuracy will be obtained by taking an average of the data or complementing it. Even when the detector is divided into two or eight parts, a 3D image will be obtained, as with the quadrant type detector. In case of a detector that is divided into two parts, although it may be difficult to get all inclination data from a measurement at one spot, a 3D structure can be calculated by comparison with measurement data at adjacent spots, which is obtained by scanning with the electron beam probe. For example, if the detector is divided into a plus side and a minus side with respect to the x axis, θy or an inclination in the y direction is calculated from a measurement at one spot with low accuracy. However, when the sample surface inclination continuously changes, there should be an adjacent spot where θy changes continuously, and an adjacent spot where θx changes continuously and low accuracy data can be complemented with data at such spots.

When a column with a resolution of 2 nm is applied to the structure, as shown in FIG. 10, the sample is measured with a high accuracy, namely one tenth or less of the dimensions such as width, height, and channel side wall angle. When high speed inspection is desired, foreign matter or cracks can be detected easily through a column with a resolution of 10-20 nm. In this case, high speed inspection is possible, since the electron probe current is in the range of 1 nA to 100 nA or more and the working distance WD is 5 mm or more. In high speed inspection, it may be sufficient to detect a defect quickly from the values of signals from sensors and their changes without calculating a 3D structure. For example, a sample whose side wall inclination is not sufficient can be detected by finding that the intensity difference of a signal from a corresponding sensor is small; or a sample whose hole is not deep enough or is clogged with foreign matter can be detected by finding that the change in signal intensity is weak. An inclined pattern surface can be identified from a difference between signals from sensors. Whether a pattern defect is caused by foreign matter or a channel can be easily determined from an intensity difference or intensity inversion of a corresponding received sensor the signal.

In the SEM according to the present invention, the electron beam acceleration is 1 kV or less, and there is no large electric field between the objective lens sample side electrode and the sample substrate 25. Hence, it offers an advantage in that a significant level of charging-up does not occur and the surface charge is kept within plus/minus several volts, so that damage to the surface of the mold 100 or its charging is reduced, and measurement is made with a high accuracy.

Since the present invention provides a SEM which is capable of making a 3D measurement, it can be applied for other purposes. For example, it may be embodied as a semiconductor or flat-panel display inspection device, or it may be used as a foreign matter or defect monitor in an etching or film making apparatus. Especially, since the apparatus according to the present invention is small, just by installing the SEM column in the sample preparation chamber together with the transport means, a monitor function can be added without the need for a new transport means or a new vacuum device.

Figure 12A:
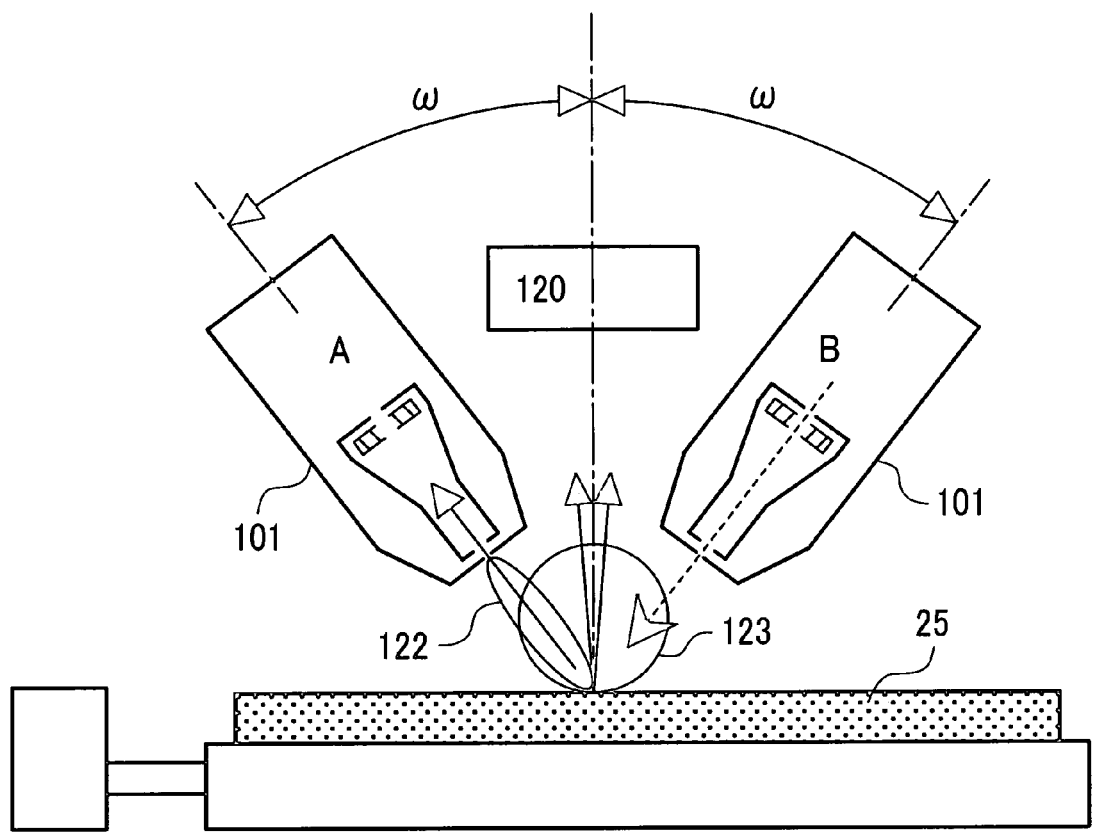
FIGS. 12A and 12B are diagrams which show a 3D observation method, where

For observation of a deeper hole or a step with an overhang, it is advisable to install two SEM columns 101, as illustrated in FIG. 12A. The two SEM columns A and B are symmetrical with respect to the normal line of the sample stage 15, and they are tilted at angle ω so that they are focused on the same spot. A secondary electron detector 120 is placed between the columns A and B to measure secondary electrons received from the sample. Stereoscopic observation based on secondary electrons can be made by using the columns A and B alternately. A distribution 122 of backscattered electrons generated by an electron beam probe emitted from the column B, which has a peak in mirror reflection from the sample, is observed by an electron detector in the column A. On the other hand, backscattered electrons generated by an electron beam probe from the column B are observed by a detector in the column A, and stereoscopic observation based on backscattered electrons is possible. When backscattered electrons are used, it is unnecessary to switch the columns A and B, and continuous operation is possible.

Figure 12B:
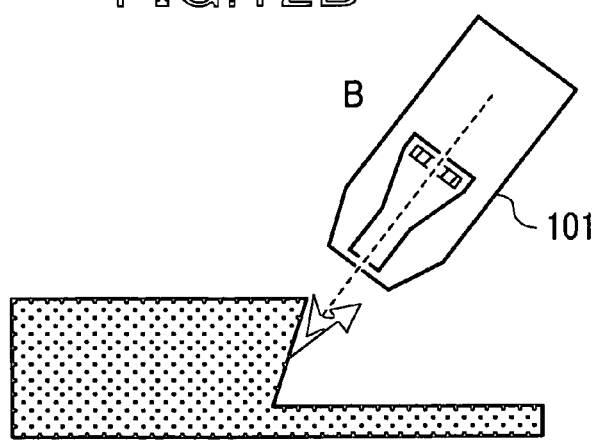

For observation of an overhang, secondary electrons generated by an electron beam probe from the column B are measured by the detector in the column B, as illustrated in FIG. 12B. Alternatively, secondary electrons or backscattered electrons generated here may be measured by the secondary electron detector 120. In this structure, a side wall inclination angle in the range from 0 (vertical) to ω can be observed. In order to broaden the observable angle range, the SEM column 101 may be moved to vary the angle ω or the working distance WD may be varied. The present invention is advantageous in that the apparatus can be compact enough to be suitable for practical use even after addition of means for varying the angle or the working distance WD, because the columns are small and are housed in the vacuum container.

Third Embodiment

Figure 13:
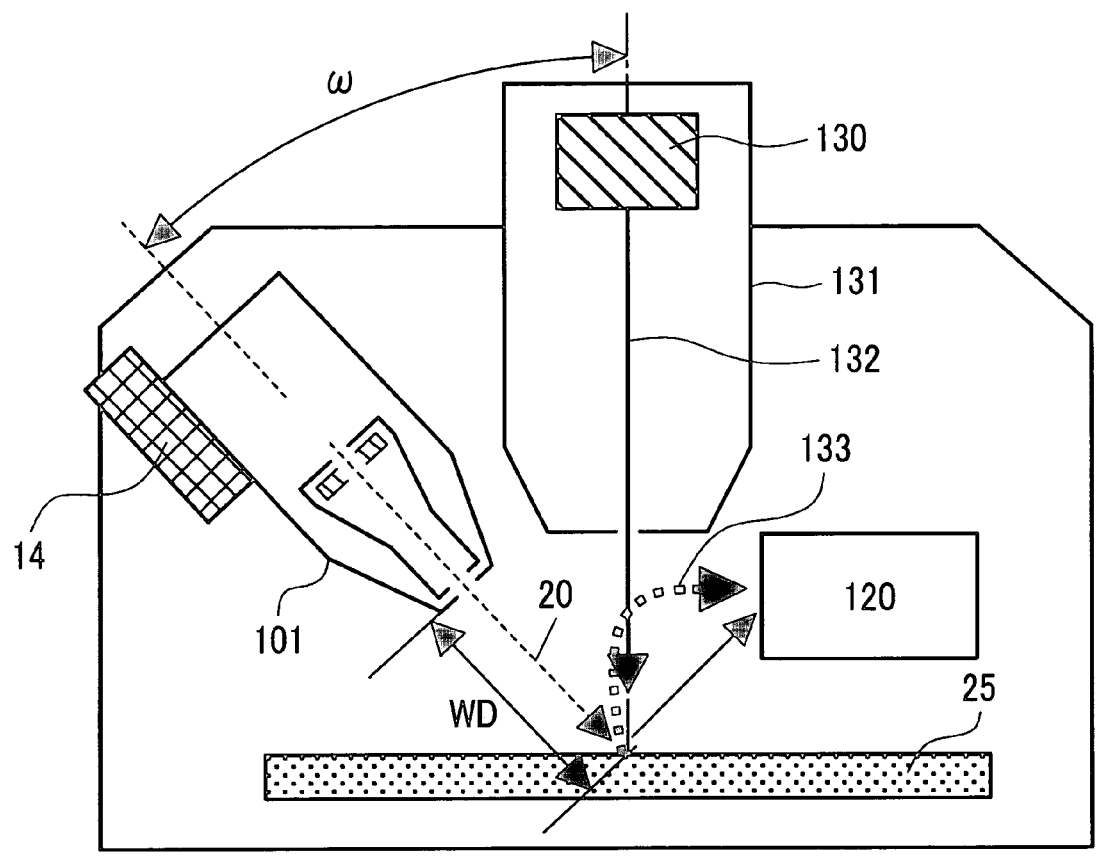
FIG. 13 is a diagram which schematically shows an ion beam system according to the present invention.

FIG. 13 shows an example of a focused ion beam system operating as a process unit, to which the present invention is applied. An ion beam probe 132, generated by an ion source 130, is focused by an electrostatic lens in an ion beam column 131 at an acceleration velocity of 10 to 30 kV, and it is cast on a sample substrate 25, whereby a desired area is cut by ion beam etching. In this system, an SEM column 101 according to the present invention, which is tilted at an angle ω, can be moved by transport means 14 to vary the working distance WD. When the working distance WD is between 5 mm and 10 mm, a wider area can be observed though the resolution is low, and staining due to sample element redeposition is reduced. Therefore, the SEM is used as a monitor during radiation of an ion beam and to detect an end point. It is also used to get an overall view of a sample area. On the other hand, when the working distance WD is shorter, specifically between 1 mm and 5 mm, observation with a higher resolution is possible, and a detailed sectional image of the sample as formed by an ion beam can be observed. Here, secondary electrons are detected inside the SEM column 101 and by a secondary electron detector 120 located separately.

Figure 14:
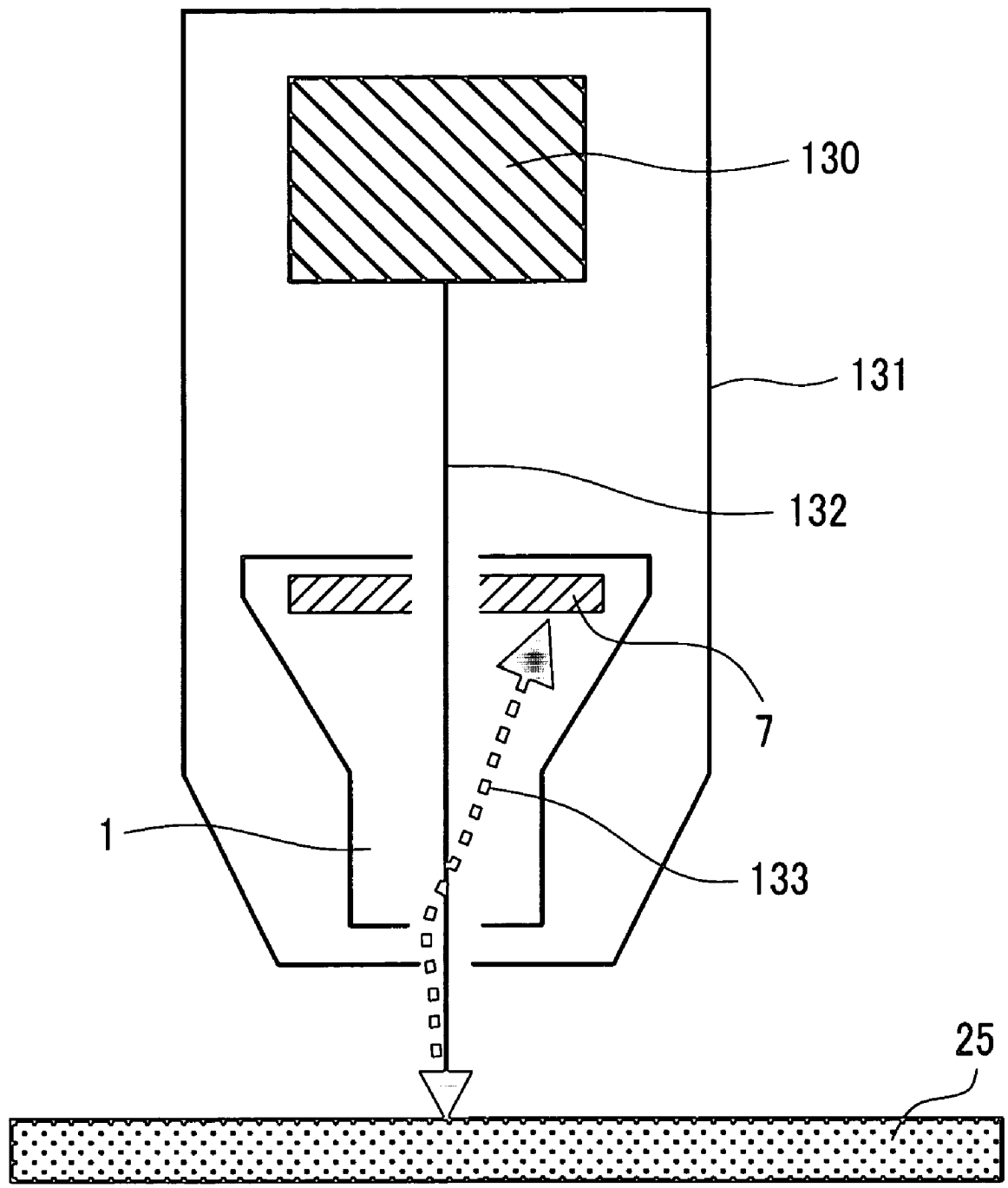
FIG. 14 is a diagram which schematically shows an ion beam column.

The present invention may be applied to a charged particle beam apparatus which is not based on the emission of electrons, like an ion beam apparatus. FIG. 14 shows a focused ion beam column 131, which uses an electron beam drift tube 1 in place of some electrostatic lens. While the accelerating voltage for the ion source 130 is between 10 kV and 30 kV, a voltage between 1 kV and 10 kV is applied to the drift tube 1, and thus the drift tube 1 forms a decelerating zone for the ion probe, where an ion beam 132 is subjected to a lens effect and is then focused on the surface of the sample substrate 25. On the other hand, secondary electrons 133 that are generated at this time are accelerated in the drift tube 1 and detected by the electron detector 7, as shown in FIG. 1.

Accordingly, the present invention makes it possible to provide a more compact ion beam column. It also has an advantage in that secondary electrons can be detected in the ion beam column 131 in a similar manner when a SEM column is located nearby and the sample is irradiated with an electron beam probe. In terms of practical utility, because a larger amount of secondary electrons are generated by the electron beam probe, the ion column 131 is used to acquire SEM image signals for the sake of compactness of the whole apparatus; thus, the column may be provided in a preparatory chamber of a process unit or an observation unit, such as a transmission electron microscope.

Fourth Embodiment

Since the SEM column according to the present invention incorporates a small pump and a secondary electron detector in a small housing, a number of SEMs of the same type can be arranged in parallel.

Figure 15:
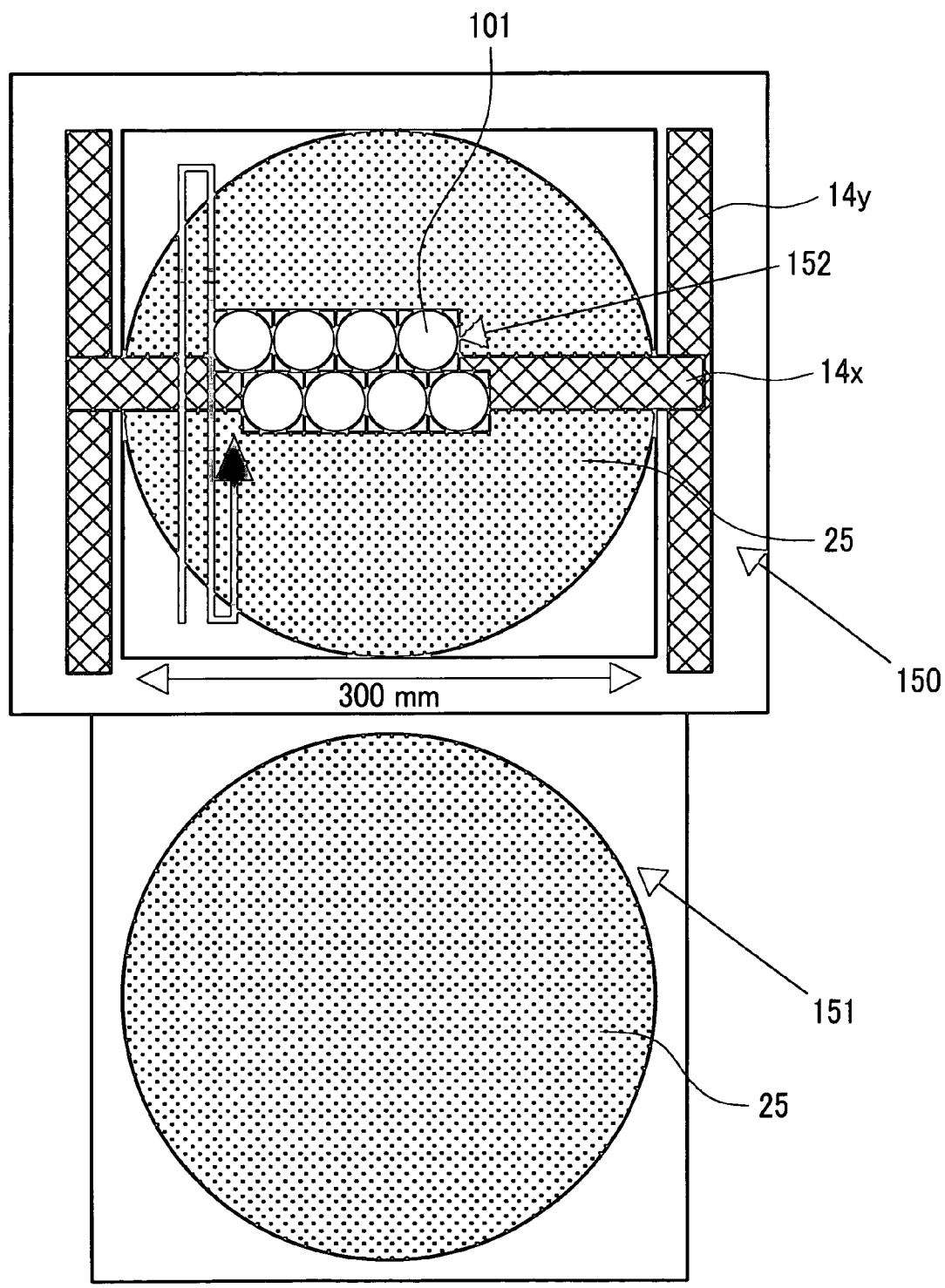
FIG. 15 is a diagram which schematically shows a fourth embodiment of the present invention.

FIG. 15 shows an outline of an inspection device which matches a wafer having a diameter of 300 mm. The inspection device has a first vacuum chamber 150 and a second vacuum chamber 151, and the sample substrate 25 is loaded or unloaded by a loader through a door for connecting or disconnecting these chambers. The second chamber 151 serves as a preparatory chamber into which the sample substrate 25 is inserted from the atmospheric air, and it is vacuumized to stand by for inspection. In the first vacuum chamber 150, eight SEM columns 101 according to the present invention are connected, each column having a diameter of 38 mm. These columns are the same as the one shown in FIG. 1, where the current of the electron beam probe is as large as 30 to 100 nA, when the working distance WD is 5 mm, and the resolution is 20 to 40 nm. The set of eight SEM columns is moved along the x and y directions by the transport means 14, for example, in the direction of the arrows indicated in FIG. 15, to inspect the pattern on the sample surface and check for a defect, such as a charge problem. This device provides up to eight times higher speed at the same probe current than the conventional inspection device, which uses only one SEM column, so that the whole sample surface can be inspected in a shorter time.

For connection of the columns, a shield 152, which shields an electric or magnetic field generated in each electron optical system within the same optical system, may be provided.

In this embodiment, a number of columns 101 are moved to cover a wide area. An alternative approach is that the columns are fixed and the sample substrate 25 is moved and inspected. In this case, the sample substrate has to move in a smaller area than when only one column is used, which means that a smaller, higher speed inspection device can be realized. In this embodiment, it is also possible to use the first vacuum chamber 150 as a preparatory chamber and the second vacuum chamber 151 as a process chamber. Here "process" refers to a fabrication step, such as etching, film making or ion implantation, which typically takes place in a vacuum. For post-process inspection or confirmation, the sample must be taken out into the atmospheric air; and, if it is to be inspected with an electron beam, it must be vacuumized again. Therefore, when a number of SEM columns are disposed in the preparatory chamber or transport chamber after vacuumization for inspection of the sample, the process-to-inspection sequence is shortened.

Figure 16:
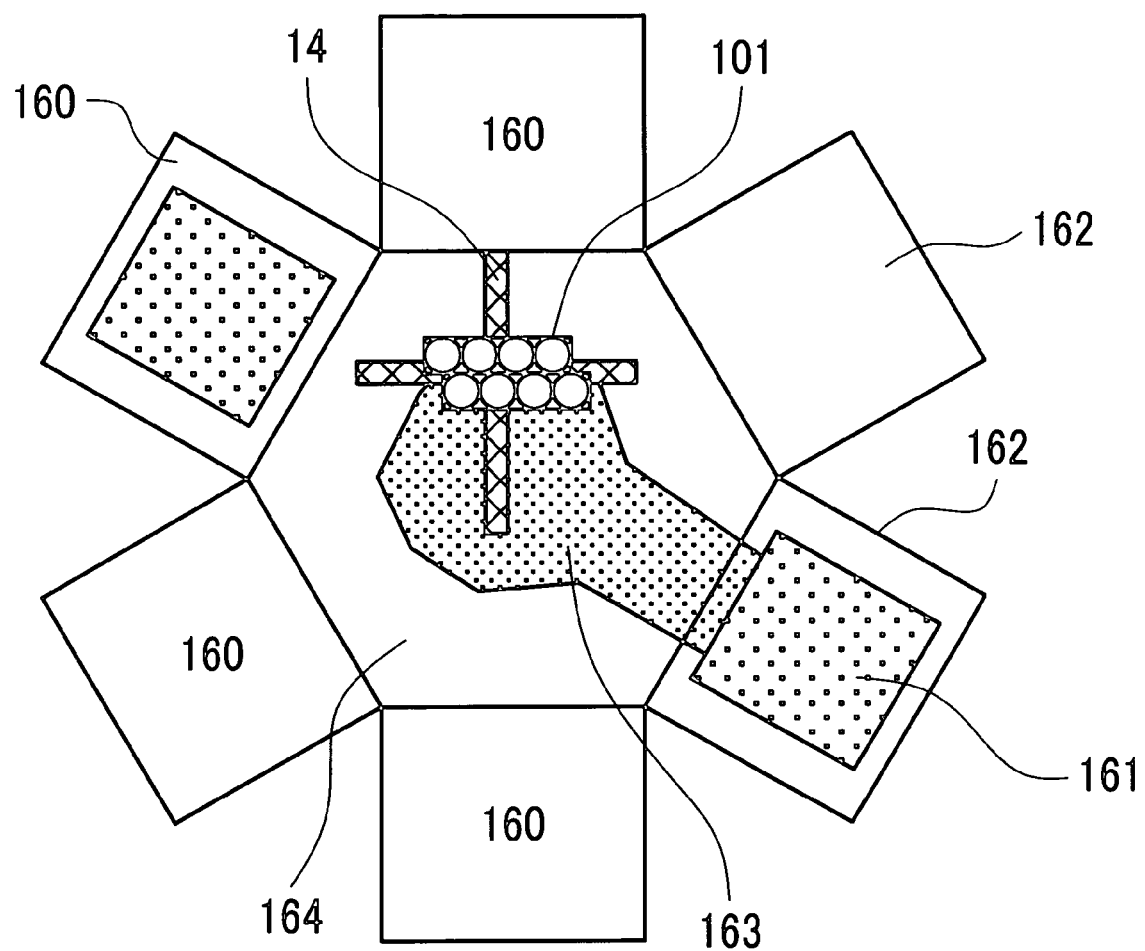
FIG. 16 is a diagram which shows display panel manufacturing equipment to which the present invention is applied.

FIG. 16 shows an example of an application of the invention to equipment for manufacturing a large flat display panel with 1 to 2 m on a side. In the equipment, four process chambers 160 and two preparatory air evacuation chambers 162 are connected around a transport chamber where a sample panel 161 is transported by a transport device 163. The entire equipment is air-evacuated by a vacuum pump, and a gate valve between chambers opens when the sample panel 161 is moved in or out.

After the sample is processed in each process chamber 160, it is checked for a defect or foreign matter, or the process condition is confirmed by the SEM columns 101 in the transport chamber 164. This brings about an effect in that the inspection step is remarkably shortened or the yield is improved. Another advantage is that, since the columns are moved by the column transport means 14 inside the transport chamber, the equipment provides a SEM function with no high extra cost and no substantial increase in equipment footprint.

What is claimed is:

1. A charged particle beam apparatus comprising:
a charged particle beam source;
means for accelerating a charged particle beam emitted from the charged particle beam source;
a drift tube which constitutes a drift zone;
a sample stage on which a sample to be irradiated with the charged particle beam rests;
a detector which detects secondary electrons or backscattered electrons generated from the sample irradiated with a charged particle beam; and
an objective lens with an aperture through which the charged particle beam passes,
wherein the objective lens is located between the drift tube and the sample stage;
wherein the charged particle beam source is located outside the drift tube; and
wherein the detector is located in the drift tube.

2. A charged particle beam apparatus comprising:
a charged particle beam source;
means for accelerating a charged particle beam emitted from the charged particle beam source;
a drift tube which constitutes a drift zone;
a sample stage on which a sample to be irradiated with the charged particle beam rests;
a detector which detects secondary electrons or backscattered electrons generated from the sample irradiated with a charged particle beam; and
an electrostatic objective lens with an aperture through which the charged particle beam passes, including electrodes facing each other,
wherein the objective lens has a first electrode on the sample side and a second electrode on the charged particle beam source side;
wherein means for maintaining the drift tube and the detector at the same electric potential is provided;
wherein the sample side principal plane of the objective lens is formed between the first electrode and the sample stage;
wherein the charged particle beam source is located outside the drift tube; and
wherein the second electrode is located on the lower face of the drift tube.

3. A charged particle beam apparatus with at least a first column and a second column comprising:
a sample stage on which a sample common to the first column and the second column rests;
a column transport mechanism for moving the first column and the second column or a sample moving mechanism for moving the sample;
the first column and the second column each including:
a charged particle beam source;
means for accelerating a charged particle beam;
a drift tube which constitutes a drift zone;
an electrostatic objective lens for irradiating the sample with the charged particle beam; and
a detector which detects secondary electrons or backscattered electrons generated from the sample irradiated with the charged particle beam;
wherein the detector is located in the drift tube;
wherein the charged particle beam source is located outside the drift tube;
wherein the first column and the second column are symmetrical with respect to an axis perpendicular to the sample stage surface; and
wherein backscattered electrons generated by irradiation of the sample with the charged particle beam from the first column are detected by the detector of the second column.

4. A charged particle beam apparatus with a plurality of columns in a vacuum chamber comprising:
a sample stage on which a sample common to the plural columns rests;
a transport mechanism for moving the plural columns or a sample moving mechanism for moving the sample;
the plural columns each including:
a charged particle beam source;
means for accelerating a charged particle beam;
a drift tube which constitutes a drift zone;
an electrostatic objective lens for irradiating the sample with the charged particle beam; and
a detector which detects secondary electrons or backscattered electrons generated from the sample irradiated with the charged particle beam;
wherein the charged particle beam source is located outside the drift tube; and
wherein the detector is located in the drift tube.

5. The charged particle beam apparatus as described in claim 1, wherein the objective lens has means for accelerating secondary electrons or backscattered electrons generated from the sample.

6. The charged particle beam apparatus as described in claim 1,
wherein the objective lens is an electrostatic objective lens including a first electrode on the sample side and a second electrode on the charged particle beam source side; and
wherein the second electrode is integral with the lower face of the drift tube.

7. The charged particle beam apparatus as described in claim 1, wherein the sample side principal plane of the objective lens is formed between the objective lens and the sample stage.

8. The charged particle beam apparatus as described in claim 1, further comprising:
a column including a charged particle beam source, means for accelerating a charged particle beam, a drift tube, an objective lens, and a detector; and
a column transport mechanism for moving the column.

9. The charged particle beam apparatus as described in claim 1, further comprising a sample stage transport mechanism for moving the sample.

10. The charged particle beam apparatus as described in claim 2, wherein distance Ldet from the second electrode to the detector in the drift tube is determined from distance Lobj between the first electrode and the second electrode, aperture size Dobj of the objective lens, and detection area outside diameter D2 of the detector, in accordance with the following formula:

$$\frac{1}{2} Lobj\left(\frac{D2}{Dobj} - 1\right) \le Ldet \le Lobj\left(\frac{D2}{Dobj} - 1\right).$$

11. The charged particle beam apparatus as described in claim 1, further comprising a controller which controls voltage applied to the drift tube, voltage applied to the charged particle beam source, and voltage applied to the sample.

12. The charged particle beam apparatus as described in claim 1, wherein the voltage applied to the drift tube is a positive voltage between 4 kV and 20 kV.

13. The charged particle beam apparatus as described in claim 1, wherein
the zone is a drift zone; and
the drift zone is formed by the controller controlling various applied voltages.

14. The charged particle beam apparatus as described in claim 1, wherein the detector has a plurality of detection areas and has means for picking up signals from the plural detection areas independently.

15. The charged particle beam apparatus as described in claim 1, further comprising means for independently detecting secondary electrons and backscattered electrons generated by irradiation of the sample with a charged particle beam.

16. The charged particle beam apparatus as described in claim 1, wherein the means for independently detecting secondary electrons and backscattered electrons is a backscattered electron detector located on the lower face of the objective lens.

17. The charged particle beam apparatus as described in claim 1, wherein the means for independently detecting secondary electrons and backscattered electrons is an electric field control electrode or a Wien filter located inside the drift tube.

18. The charged particle beam apparatus as described in claim 1, further comprising:
an electron gun including the charged particle beam source and an extraction electrode; and
a non-evaporative getter pump for vacuumizing the electron gun; and
means for heating the non-evaporative getter pump.

19. The charged particle beam apparatus as described in claim 18, wherein a vacuum diaphragm of the electron gun has gas bypass means.

20. The charged particle beam apparatus as described in claim 19, wherein the gas bypass means includes a bypass hole and a thermal deformation element such as bimetal for opening/closing the hole.

* * * * *